(12) United States Patent
Wakabayashi

(10) Patent No.: US 10,705,421 B2
(45) Date of Patent: Jul. 7, 2020

(54) IMPRINT APPARATUS AND METHOD OF MANUFACTURING ARTICLE

(71) Applicant: CANON KABUSHIKI KAISHA, Tokyo (JP)

(72) Inventor: Kohei Wakabayashi, Toyama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 485 days.

(21) Appl. No.: 15/086,594

(22) Filed: Mar. 31, 2016

(65) Prior Publication Data

US 2016/0297136 A1 Oct. 13, 2016

(30) Foreign Application Priority Data

Apr. 9, 2015 (JP) .................................. 2015-080345

(51) Int. Cl.
*G03F 7/00* (2006.01)
*B29C 64/20* (2017.01)
(Continued)

(52) U.S. Cl.
CPC ............ *G03F 7/0002* (2013.01); *B29C 64/00* (2017.08); *B29C 64/20* (2017.08); *B29C 33/424* (2013.01);
(Continued)

(58) Field of Classification Search
CPC ....... G03F 7/0002; B33Y 30/00; B33Y 50/00; B33Y 50/02; B33Y 10/00; B29C 64/00;
(Continued)

(56) References Cited

U.S. PATENT DOCUMENTS 4,887,282 A * 12/1989 Mueller .................. G03F 7/702
378/208
8,764,431 B2 7/2014 Yamashita et al.
(Continued)

FOREIGN PATENT DOCUMENTS

CN 102929099 A 2/2013
CN 104094379 A 10/2014
(Continued)

OTHER PUBLICATIONS

Janssen (Control Unit (CU), Techopedia, Apr. 3, 2014, p. 1). (Year: 2014).*
(Continued)

*Primary Examiner* — Robert C Dye
*Assistant Examiner* — Sedef E Paquette
(74) *Attorney, Agent, or Firm* — Rossi, Kimms & McDowell LLP

(57) ABSTRACT

The present invention provides an imprint apparatus which forms a pattern in an imprint material on a substrate using a mold, the apparatus comprising a deformation unit configured to deform at least one of the mold and the substrate, and a control unit configured to control a process of starting contact between the mold and the imprint material in a state in which the at least one is deformed, and then gradually increasing a contact area between the mold and the imprint material by gradually decreasing a deformation amount of the at least one, wherein the control unit controls relative positions of the mold and the substrate based on the deformation amount, so as to maintain a relative positional relationship between the mold and the substrate at a region where the mold and the imprint material are contact with each other.

15 Claims, 8 Drawing Sheets

(51) Int. Cl.
*B29C 64/00* (2017.01)
*B29L 7/00* (2006.01)
*B33Y 50/02* (2015.01)
*B33Y 10/00* (2015.01)
*B33Y 30/00* (2015.01)
*B33Y 50/00* (2015.01)
*B29C 64/245* (2017.01)
*B29C 64/205* (2017.01)
*B29C 33/42* (2006.01)

(52) U.S. Cl.
CPC .......... *B29C 64/205* (2017.08); *B29C 64/245* (2017.08); *B29L 2007/001* (2013.01); *B33Y 10/00* (2014.12); *B33Y 30/00* (2014.12); *B33Y 50/00* (2014.12); *B33Y 50/02* (2014.12)

(58) Field of Classification Search
CPC .................. B29C 64/10; B29C 64/20; B29C 64/205–379; B29C 43/021; B29C 43/58; B29C 33/424; B29C 2043/5833; B29C 2043/5891; B29L 2031/34
USPC ........................................................ 264/40.7
See application file for complete search history.

(56) References Cited

U.S. PATENT DOCUMENTS

| | | |
|---|---|---|
| 9,280,047 B2 | 3/2016 | Tanaka et al. |
| 2005/0064054 A1* | 3/2005 | Kasumi .................. B82Y 10/00 425/112 |
| 2006/0005657 A1* | 1/2006 | Choi ..................... B29C 43/021 74/490.07 |
| 2006/0172553 A1* | 8/2006 | Choi .................. H01L 21/6831 438/780 |
| 2011/0217479 A1 | 9/2011 | Yamashita et al. |
| 2012/0086149 A1* | 4/2012 | Yoshida ................. B82Y 10/00 264/293 |
| 2013/0037981 A1* | 2/2013 | Tanaka .................. G03F 7/0002 264/40.5 |
| 2013/0056904 A1* | 3/2013 | Hamaya ................ G03F 7/0002 264/293 |
| 2013/0056905 A1 | 3/2013 | Hamaya et al. |
| 2013/0181365 A1 | 7/2013 | Shinoda et al. |
| 2014/0239529 A1* | 8/2014 | Tan ....................... G03F 7/0002 264/40.5 |
| 2014/0320842 A1 | 10/2014 | Sato |

FOREIGN PATENT DOCUMENTS

| | | | |
|---|---|---|---|
| CN | 104094380 A | | 10/2014 |
| CN | 104122746 A | | 10/2014 |
| JP | 2009518207 A | | 5/2009 |
| JP | 2010228174 A | * | 10/2010 |
| JP | 2011211157 A | | 10/2011 |
| JP | 2013058517 A | | 3/2013 |
| JP | 2013145854 A | | 7/2013 |
| JP | 2014225637 A | | 12/2014 |
| JP | 2015056589 A | | 3/2015 |
| TW | 201311425 A1 | | 3/2013 |
| TW | 201441061 A | | 11/2014 |
| WO | 2007067469 A2 | | 6/2007 |
| WO | 2012013384 A1 | | 2/2012 |

OTHER PUBLICATIONS

Merriam-Webster, Definition for "Position", pp. 1-3. (Year: 2014).*
Yutaka Kinugasa, JP-2010228174-A, machine translation. (Year: 2010).*
Office Action issued in Taiwanese Application No. 105109723 dated Apr. 13, 2017. English translation provided.
Office Action issued in Chinese Application No. 201610213402.9 dated May 5, 2019. English translation provided.
Office Action issued in Japanese Application No. 2015-080345 dated Feb. 15, 2019.

* cited by examiner

IMPRINT APPARATUS AND METHOD OF MANUFACTURING ARTICLE

BACKGROUND OF THE INVENTION

1. Field of the Invention

The present invention relates to an imprint apparatus and a method of manufacturing an article.

2. Description of the Related Art

An imprint apparatus which forms a pattern in an imprint material on a substrate using a mold where a concave-convex pattern has been formed has received attention as one of lithography apparatuses for mass-producing semiconductor devices and the like. The imprint apparatus can form the pattern in the imprint material on the substrate by performing an imprint process of curing the imprint material on the substrate in a state in which the mold and the imprint material are in contact with each other. In such an imprint apparatus, if bubbles remain in the concave portion of the pattern of the mold when bringing the mold and the imprint material into contact with each other, a defect may occur in the pattern formed by the imprint material. Japanese Patent Laid-Open No. 2009-518207 has proposed a method of reducing bubbles remaining in the concave portion of a pattern of a mold by bringing the mold and an imprint material into contact with each other in a state in which the mold is deformed into a convex shape with its center protruding toward a substrate.

In the imprint apparatus described in Japanese Patent Laid-Open No. 2009-518207, the contact area between the mold and the imprint material is increased gradually by decreasing the deformation amount of the mold gradually after contact between the mold and the imprint material is started. While increasing the contact area, however, the relative positions of the mold and the substrate may change by decreasing a mold deformation gradually. In the imprint apparatus described in Japanese Patent Laid-Open No. 2009-518207, a change in the relative positions of the mold and the substrate is not considered while increasing the contact area. Consequently, it becomes difficult, by the change in the relative positions, to perform alignment between the mold and the substrate quickly, and throughput may be decreased.

SUMMARY OF THE INVENTION

The present invention provides an imprint apparatus advantageous, for example, in terms of throughput.

According to one aspect of the present invention, there is provided an imprint apparatus which forms a pattern in an imprint material on a substrate using a mold, the apparatus comprising: a deformation unit configured to deform at least one of the mold and the substrate into a convex shape protruding toward the other; and a control unit configured to control a process of starting contact between the mold and the imprint material in a state in which the at least one is deformed by the deformation unit, and gradually increasing a contact area between the mold and the imprint material by gradually decreasing a deformation amount of the at least one by the deformation unit, wherein the control unit controls relative positions of the mold and the substrate based on the deformation amount of the at least, so as to maintain, while increasing the contact area, a relative positional relationship between the mold and the substrate at a region where the mold and the imprint material are contact with each other.

Further features of the present invention will become apparent from the following description of exemplary embodiments with reference to the attached drawings.

DESCRIPTION OF THE EMBODIMENTS

Figure 1:
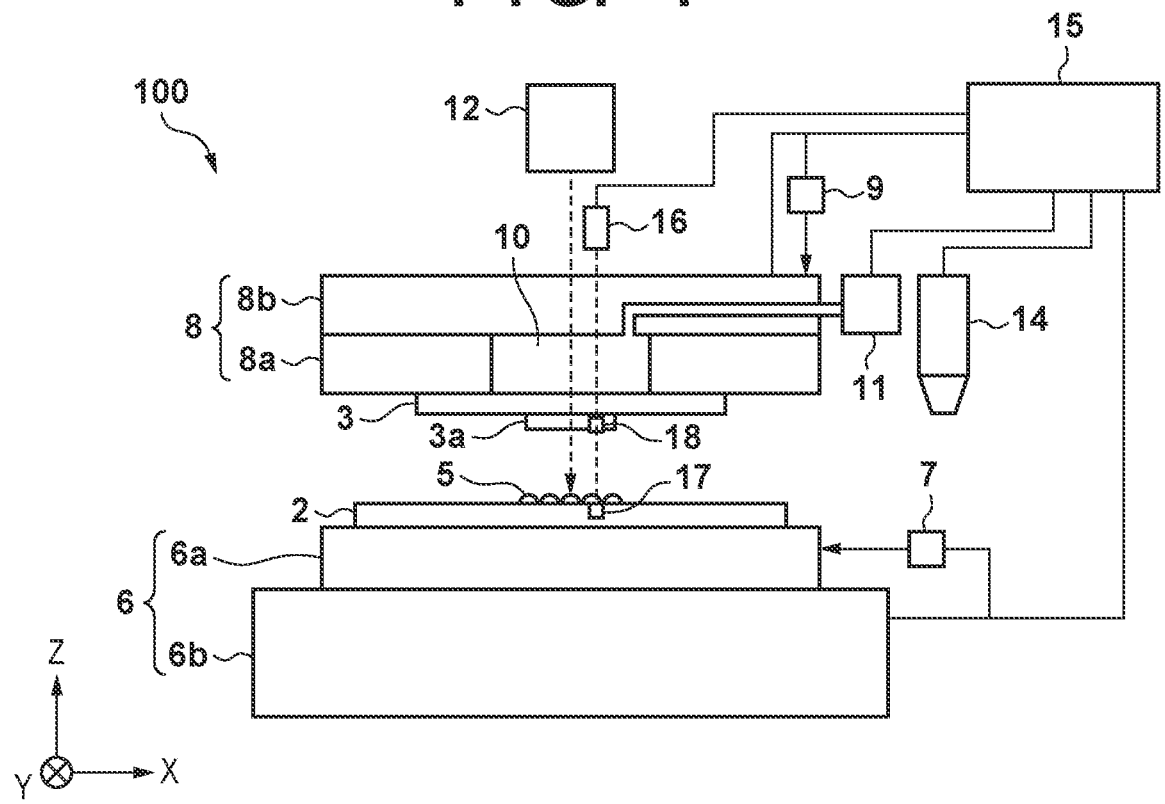
FIG. 1 is a schematic view showing an imprint apparatus according to the first embodiment.

Exemplary embodiments of the present invention will be described below with reference to the accompanying drawings. Note that the same reference numerals denote the same members throughout the drawings, and a repetitive description thereof will not be given. In a description below, let the first direction be a direction (for example, a Z direction) in which a mold and an imprint material are brought into contact with each other, and let the second directions be directions (for example, X and Y directions) perpendicular to the first direction.

First Embodiment

An imprint apparatus 100 according to the first embodiment of the present invention will now be described. The imprint apparatus 100 is used to manufacture a semiconductor device or the like and performs an imprint process of forming a pattern in an imprint material 5 supplied on a shot region of a substrate 2 using a mold 3 including a pattern region 3a where a pattern has been formed. For example, the imprint apparatus 100 cures the imprint material 5 on the substrate in a state in which the mold 3, where the pattern has been formed, is in contact with the imprint material 5. Then, the imprint apparatus 100 can form the pattern in the imprint material 5 on the substrate by widening the spacing between the mold 3 and the substrate 2, and separating (releasing) the mold 3 from the cured imprint material 5. A method of curing the imprint material 5 includes a heat cycle method using heat and a photo-curing method using light. In the first embodiment, an example in which the photo-curing method is adopted will be described. The photo-curing method is a method of curing the imprint material 5 by supplying an uncured ultraviolet-curing resin as the imprint material 5 on the substrate, and irradiating the imprint material 5 with ultraviolet rays in a state in which the mold 3 and the imprint material 5 are in contact with each other.

[Configuration of Imprint Apparatus 100]

FIG. 1 is a schematic view showing the imprint apparatus 100 according to the first embodiment. The imprint apparatus 100 can include an irradiation unit 12, a mold holding unit 8, a substrate holding unit 6, a supply unit 14, a detection unit 16, and a control unit 15. The control unit 15 includes, for example, a CPU and a memory, and controls the imprint process (controls the respective units of the imprint apparatus 100).

The irradiation unit 12 irradiates the imprint material 5 on the substrate via the mold 3 with light (ultraviolet rays) curing the imprint material 5 in the imprint process. The irradiation unit 12 can include, for example, a light source and an optical element for adjusting light emitted from the light source to light suitable for the imprint process. Note that, for example, when a thermosetting method is adopted, a heat source unit for curing a thermosetting resin serving as the imprint material 5 can be provided instead of the irradiation unit 12.

As the substrate 2, for example, a single-crystal silicon substrate, a glass substrate, or the like is used. The supply unit 14 to be described later supplies the imprint material 5 to the upper surface (processed surface) of the substrate 2. The mold 3 is normally made of a material such as quartz capable of transmitting ultraviolet rays. A concave-convex pattern for forming the imprint material 5 on the substrate is formed in a partial region (pattern region 3a) on a substrate side.

The substrate holding unit 6 can include a substrate chuck 6a which holds the substrate 2 by, for example, a vacuum suction force or an electrostatic force, and a substrate driving unit 6b configured to change the position and the tilt of the substrate 2 held by the substrate chuck 6a. For example, the substrate driving unit 6b can be configured to drive the substrate 2 in the first direction (for example, a Z direction) in which the mold 3 and the imprint material 5 are brought into contact with each other or in the second directions (for example, X and Y directions) perpendicular to the first direction, or to tilt the substrate 2 (in a rotation direction). A measuring device (to be referred to as a first measuring device 7 hereinafter) which measures the position and the tilt of the substrate 2 is provided in the imprint apparatus 100. The control unit 15 can control the substrate driving unit 6b based on the position and the tilt of the substrate 2 measured by the first measuring device 7. The first measuring device 7 can include, for example, a laser interferometer or an encoder.

The mold holding unit 8 can include a mold chuck 8a which holds the mold 3 by, for example, the vacuum suction force or the electrostatic force, and a mold driving unit 8b configured to change the position and the tilt of the mold 3 held by the mold chuck 8a. For example, the mold driving unit 8b can be configured to drive the mold 3 in the first direction (for example, the Z direction) in which the mold 3 and the imprint material 5 are brought into contact with each other or to tilt the mold 3 (in the rotation direction). The mold driving unit 8b may also be configured to drive the mold 3 in the second directions (for example, the X and Y directions) perpendicular to the first direction. A measuring device (to be referred to as a second measuring device 9 hereinafter) which measures the position and the tilt of the mold 3 is provided in the imprint apparatus 100. The control unit 15 can control the mold driving unit 8b based on the position and the tilt of the mold 3 measured by the second measuring device 9. The second measuring device 9 can include, for example, a laser interferometer or an encoder.

Note that in the imprint apparatus 100 of the first embodiment, an operation of changing the relative positions of the mold 3 and the substrate 2 in the second directions can be performed by controlling at least one of the substrate driving unit 6b and the mold driving unit 8b. An operation of changing the spacing (in the first direction) between the mold 3 and the substrate 2 can also be performed by controlling at least one of the substrate driving unit 6b and the mold driving unit 8b.

For example, the detection unit 16 detects a mark 18 provided on the mold 3 and a mark 17 provided on the substrate 2 (shot region 2a) in the state in which the mold 3 and the imprint material 5 on the substrate are in contact with each other. This allows the control unit 15 to obtain the relative positions (in the X and Y directions) of the mark 18 on the mold and the mark 17 on the substrate based on a result of a detection by the detection unit 16, and to perform alignment between the mold 3 and the substrate 2 such that the relative positions become target relative positions. The supply unit 14 supplies the imprint material 5 (uncured resin) on the substrate. As described above, in the imprint apparatus 100 of the first embodiment, the ultraviolet-curing resin having a property of curing by ultraviolet-ray irradiation is used as the imprint material 5.

In the imprint apparatus 100, if bubbles remain in the concave portion of the pattern of the mold 3 when bringing the imprint material 5 and the pattern region 3a of the mold 3 into contact with each other, a defect may occur in the pattern formed by the imprint material 5. To cope with this, the imprint apparatus 100 includes a deformation unit which deforms at least one of the pattern region 3a of the mold 3 and each shot region 2a of the substrate 2 into a convex shape with its central portion protruding toward another. The imprint apparatus 100 starts contact between the pattern region 3a and the imprint material 5 in a state in which at least one of the pattern region 3a and each shot region 2a is deformed by the deformation unit. Then, the imprint apparatus 100 gradually increases the contact area between the mold 3 and the imprint material 5 by gradually reducing at least one of the deformations. It is possible to reduce the bubbles remaining in the concave portion of the pattern of the mold 3 by controlling a process of bringing the mold 3 (pattern region 3a) and the imprint material 5 into contact with each other as described above. In the first embodiment, an example will be described in which the pattern region 3a of the mold 3 is deformed into the convex shape with its central portion protruding toward the substrate 2 in the process of bringing the pattern region 3a of the mold 3 and the imprint material 5 on the substrate into contact with each other.

Figure 2:
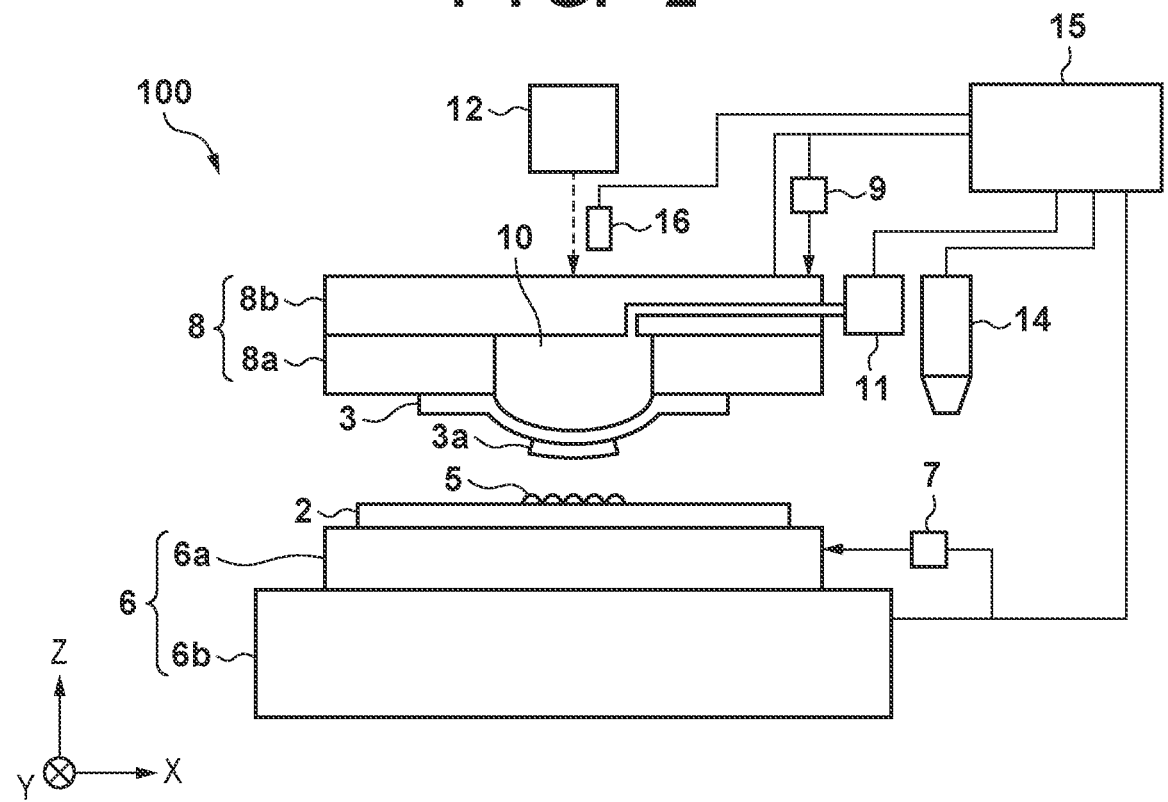
FIG. 2 is a schematic view showing the imprint apparatus in a state in which a pattern region of a mold is deformed.

For example, a space 10 defined by the mold 3, the mold chuck 8a, and the mold driving unit 8b can be formed in the mold holding unit 8. A first deformation unit 11 serving as the deformation unit is connected to the space 10 via a pipe. As shown in FIG. 2, the first deformation unit 11 can deform, by adjusting a pressure of the space 10, the pattern region 3a of the mold 3 into the convex shape with its central portion protruding toward the substrate 2. FIG. 2 is a schematic view showing the imprint apparatus 100 in a state in which the pattern region 3a of the mold 3 is deformed. For example, when contact between the pattern region 3a and the imprint material 5 on the substrate is started by narrowing the spacing between the mold 3 and the substrate 2, the control unit 15 controls the first deformation unit 11 to deform the pattern region 3a into the convex shape by adjusting the pressure of the space 10 to be higher than its external pressure. After contact between the pattern region 3a and the imprint material 5 is started, the control unit 15 controls the first deformation unit 11 so as to gradually decrease the pressure of the space 10 and to gradually reduce the deformation of the pattern region 3a. This allows the imprint apparatus 100 to gradually increase the contact area between the pattern region 3a and the imprint material 5, that is, gradually bring the pattern region 3a and the imprint material 5 into contact with each other from a portion of the pattern region 3a. As a result, it is possible to reduce a gas trapped between the imprint material 5 and the concave portion of the pattern of the mold 3, and to prevent the defect from occurring in the pattern formed by the imprint material 5.

[Imprint Process for Each Shot Region 2a]

Figure 3:
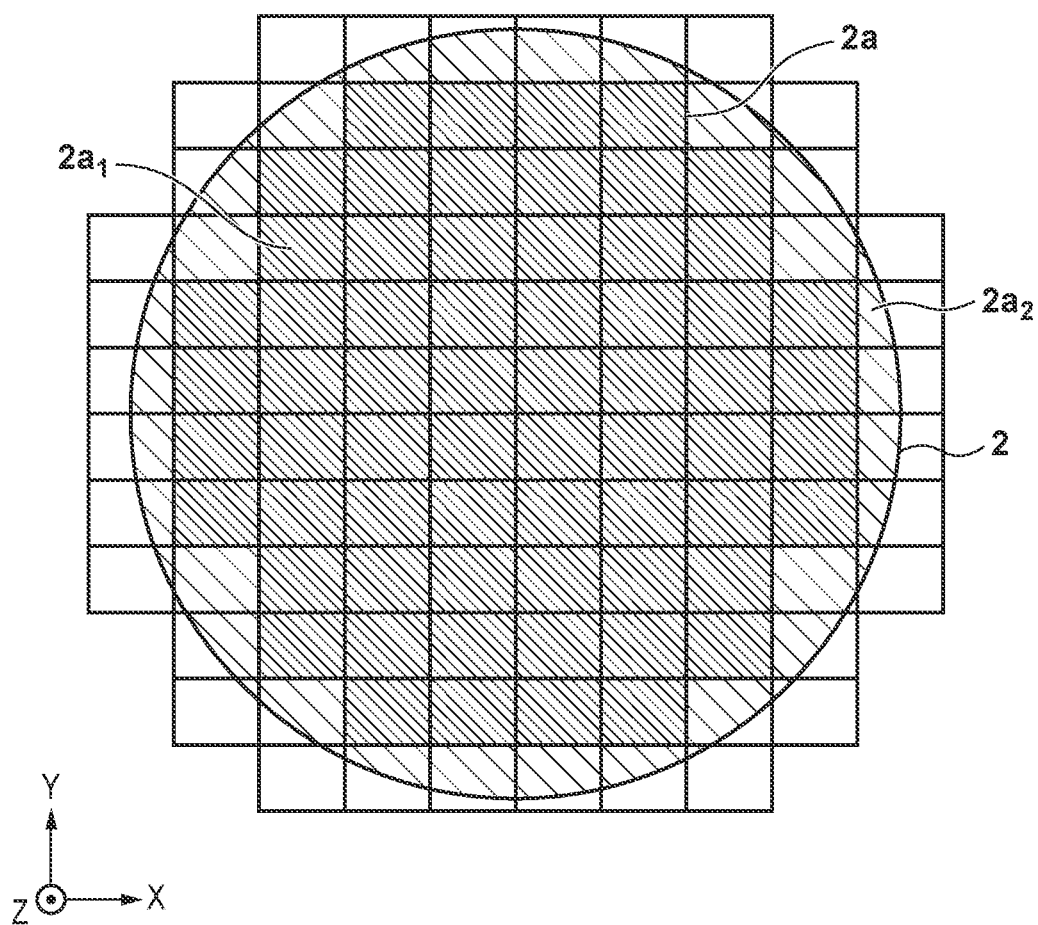
FIG. 3 is a view showing the arrangement of a plurality of shot regions on a substrate.

FIG. 3 is a view showing the arrangement of the plurality of shot regions 2a on the substrate. The plurality of shot regions 2a on the substrate include a shot region $2a_1$ which is arranged in the central portion of the substrate 2 and to which the entire pattern of the mold 3 is transferred, and a shot region $2a_2$ which is arranged in the peripheral portion of the substrate 2 and to which only a part of the pattern of the mold 3 is transferred. The shot region $2a_2$ which is arranged in the peripheral portion of the substrate 2 and to which only the part of the pattern of the mold 3 is transferred as described above is referred to as a deficient shot region (edge shot region). The imprint apparatus 100 preferably performs the imprint process on the deficient shot region as well in order to improve a yield. However, if the distance between the mold 3 and the substrate 2 is decreased without controlling the relative tilts between them in the state in which the pattern region 3a of the mold 3 is deformed, the pattern region 3a may contact the edge of the substrate 2. In this case, the imprint material 5 is not often supplied to the edge of the substrate 2, and thus the mold 3 and the substrate 2 contact directly without going through the imprint material 5. This may damage the pattern of the mold 3.

The imprint apparatus 100 of the first embodiment controls the relative tilts between the mold 3 and the substrate 2 in accordance with the deformation of the pattern region 3a so as to start contact between the imprint material 5 and the pattern region 3a of the mold 3 from a target portion 21 of the shot regions 2a. That is, the imprint apparatus 100 controls the relative tilts between the mold 3 and the substrate 2 so as to start contact between the imprint material 5 and the pattern region 3a of the mold 3 from a portion other than the barycenter of the pattern of the mold 3 (a portion other than a portion where the mold 3 protrudes the most).

Further, the imprint apparatus 100 gradually decreases the deformation amount of the pattern region 3a by the first deformation unit 11, and gradually reduces the relative tilts between the mold 3 and the substrate 2 as the contact area between the pattern region 3a and the imprint material 5 is increased. That is, the imprint apparatus 100 controls the relative tilts between the mold 3 and the substrate 2 in accordance with the deformation of the pattern region 3a by the first deformation unit 11 such that the pattern region 3a of the mold 3 and the shot regions 2a of the substrate 2 become parallel to each other when the spacing between the mold 3 and the substrate 2 becomes a target spacing. However, the relative positions of the mold 3 and the substrate 2 may shift in the second directions (X and Y directions) while controlling the deformation of the pattern region 3a, and the relative tilts between the mold 3 and the substrate 2 as described above. In this case, a considerable time is required, due to the viscosity of the imprint material 5, until the relative positions of the mold 3 and the substrate 2 are settled. This makes it difficult to quickly perform alignment between the mold 3 and the substrate 2, and throughput may be decreased.

To cope with this, the imprint apparatus 100 (control unit 15) controls the relative positions of the mold 3 and the substrate 2 so as to maintain, while increasing the contact area, the positional relationship between the mold 3 and the substrate 2 when contact between the mold 3 and the imprint material 5 is started. At this time, the imprint apparatus 100 performs feedforward control of the relative positions of the mold 3 and the substrate 2 based on the deformation amount of the pattern region 3a by the first deformation unit 11. For example, the imprint apparatus 100 controls, while increasing the contact area, the relative positions of the mold 3 and the substrate 2 based on the deformation amount of the pattern region 3a such that the shift between the target portion 21 of the shot regions 2a and a corresponding portion 22 of the pattern region 3a keeps an allowable range. The target portion 21 of the shot regions 2a is a portion of the shot regions 2a with which the pattern region 3a of the mold 3 should be brought into contact first via the imprint material 5. The corresponding portion 22 of the pattern region 3a is a portion of the pattern region 3a where a pattern that should be transferred to the target portion 21 of the shot regions 2a has been formed.

Figure 4:
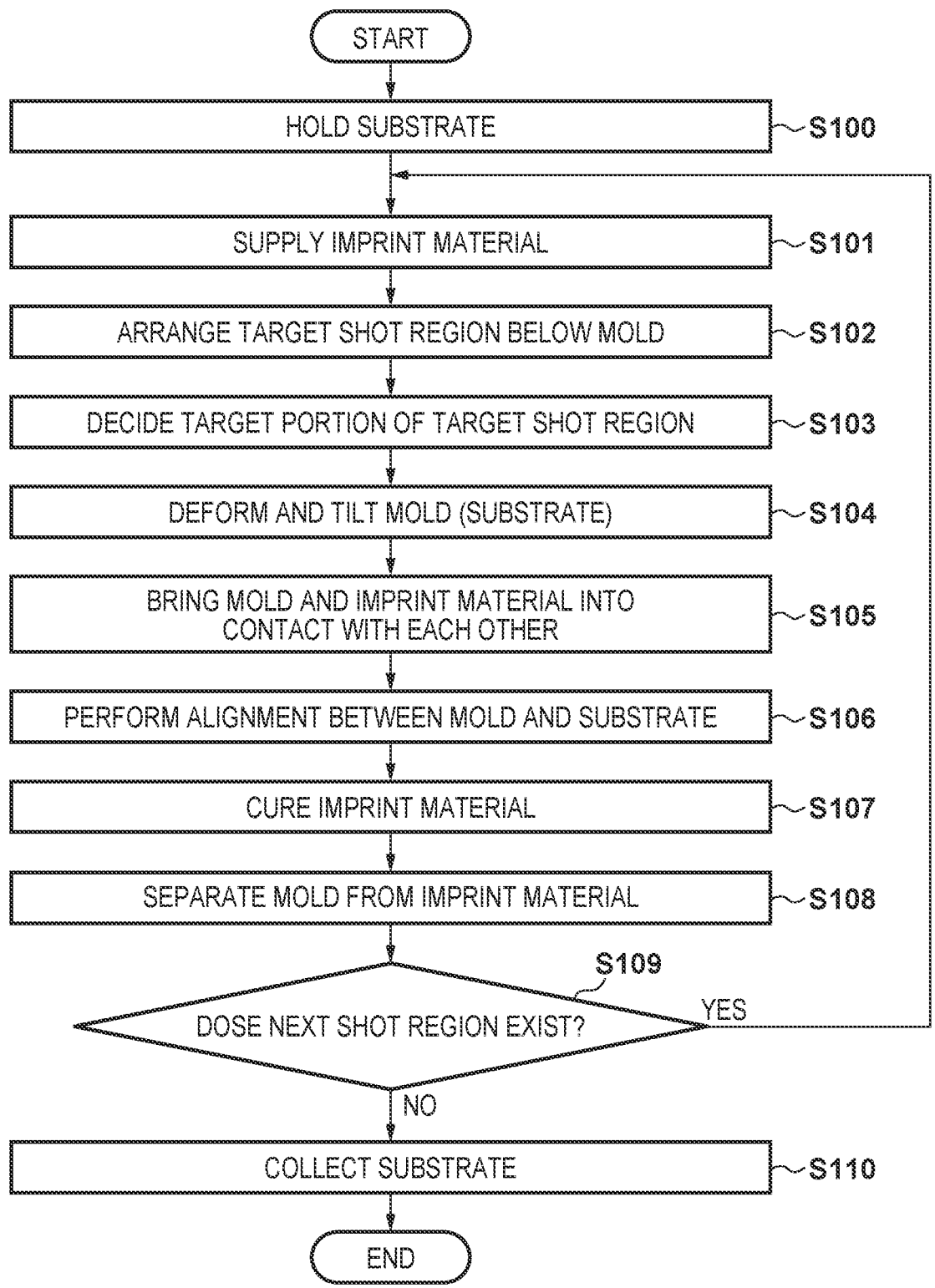
FIG. 4 is a flowchart showing an operation sequence of an imprint process in the imprint apparatus according to the first embodiment.

The imprint process for each shot region 2a on the substrate will now be described with reference to FIG. 4. FIG. 4 is a flowchart showing an operation sequence of the imprint process in the imprint apparatus 100 of the first embodiment. Each operation shown in FIG. 4 can be performed by causing the control unit 15 to control each unit of the imprint apparatus 100.

In step S100, the control unit 15 controls a substrate conveying mechanism (not shown) to convey the substrate 2 onto the substrate holding unit 6 and controls the substrate holding unit 6 to hold the substrate 2. Consequently, the substrate 2 is mounted on the substrate holding unit 6. In step S101, the control unit 15 controls the substrate holding unit 6 to arrange the shot region 2a targeted for performing the imprint process (to be referred to as the target shot region 2a hereinafter) under the supply unit 14 and controls the supply unit 14 to supply the imprint material 5 to the target shot region 2a. In step S102, the control unit 15 controls the substrate holding unit 6 to arrange the target shot region 2a below the pattern region 3a of the mold 3.

In step S103, the control unit 15 decides the target portion 21 of the target shot region 2a where contact between the pattern region 3a of the mold 3 and the imprint material 5 on the substrate is started. The target portion 21 of the target shot region 2a preferably includes the barycenter of the target shot region 2a. For example, when the target shot region 2a is the deficient shot region, the control unit 15 can obtain the barycenter of the deficient shot region serving as the target shot region 2a and decide the target portion 21 of the target shot region 2a so as to include the barycenter. Note that the control unit 15 may obtain the barycenter of the target shot region 2a from information indicating the arrangement of the plurality of shot regions 2a on the substrate as shown in FIG. 3 or from an image obtained by an image capturing unit provided to capture the target shot region 2a. In the first embodiment, the control unit 15 also decides the target portion 21 of the target shot region 2a so as to include the barycenter of the target shot region 2a. However, the present invention is not limited to this. For example, the control unit 15 may, using a dummy substrate, observe a change in the contact area between the pattern region 3a and the imprint material 5 while decreasing the distance between the mold 3 and the substrate 2 by the image capturing unit, and may decide the target portion 21 of the target shot region 2a based on that result.

Figure 5:
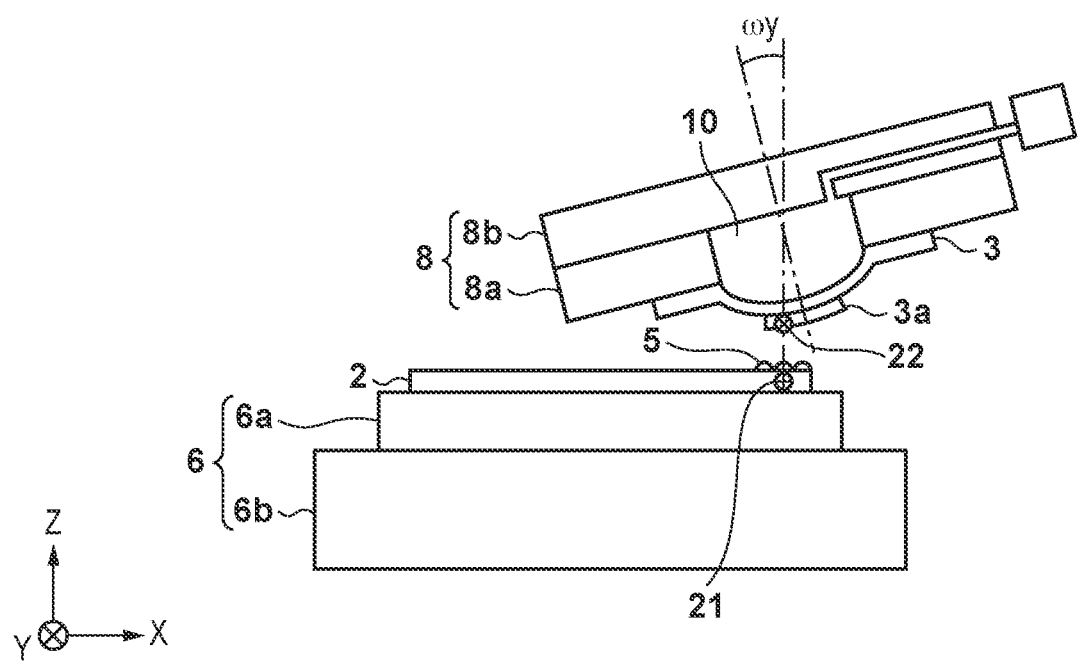
FIG. 5 is a view showing a state in which the mold is tilted such that a corresponding portion of the pattern region deformed into a convex shape becomes the lowest position in the first direction.

In step S104, the control unit 15 causes the first deformation unit 11 to deform the pattern region 3a of the mold 3 into the convex shape, and controls the relative tilts between the mold 3 and the substrate 2 so as to start contact between the pattern region 3a and the imprint material 5 from the target portion 21 of the target shot region 2a. In order to start contact between the pattern region 3a and the imprint material 5 from the target portion 21 of the target shot region, the mold 3 is preferably tilted such that the corresponding portion 22 out of the pattern region 3a deformed into the convex shape becomes the lowest position in the first direction, as shown in FIG. 5. That is, the mold 3 is preferably tilted to arrange the corresponding portion 22 on the side closest to the substrate. Therefore, the control unit 15 preferably causes the mold holding unit 8 to tilt the mold 3 in accordance with the deformation of the pattern region 3a such that the corresponding portion 22 of the pattern region 3a becomes the lowest position in the first direction.

Figure 6:
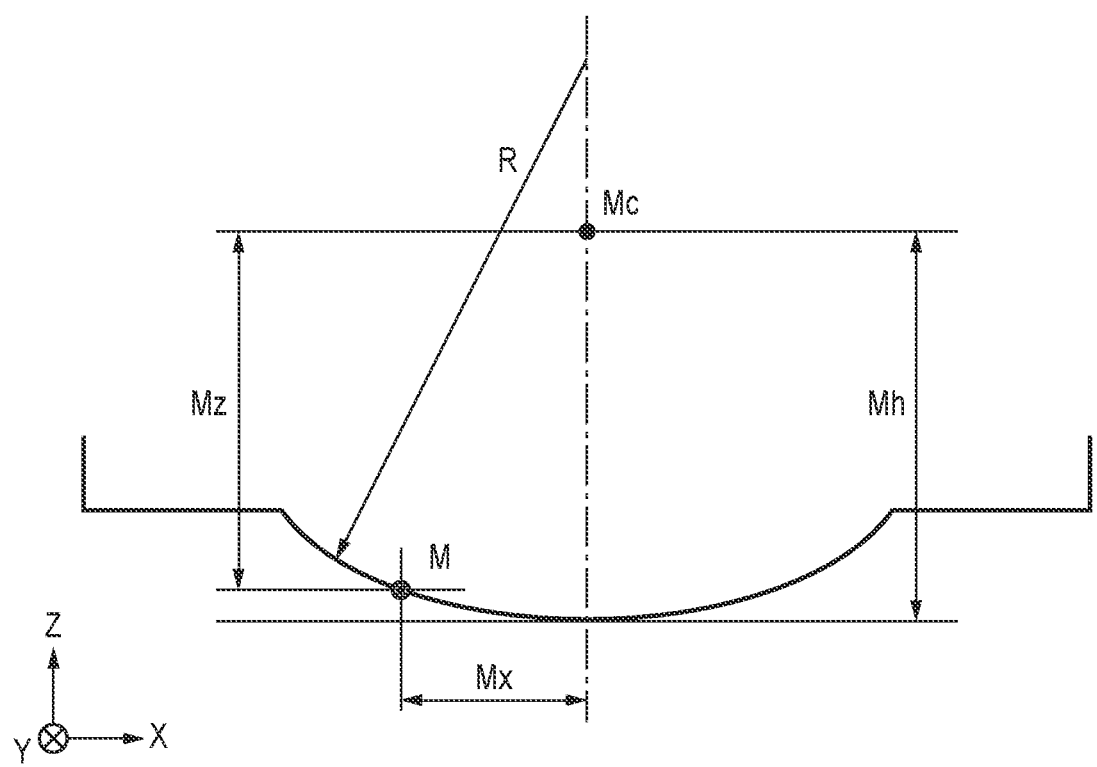
FIG. 6 is a model view showing the pattern region deformed into the convex shape.
Figure 7:
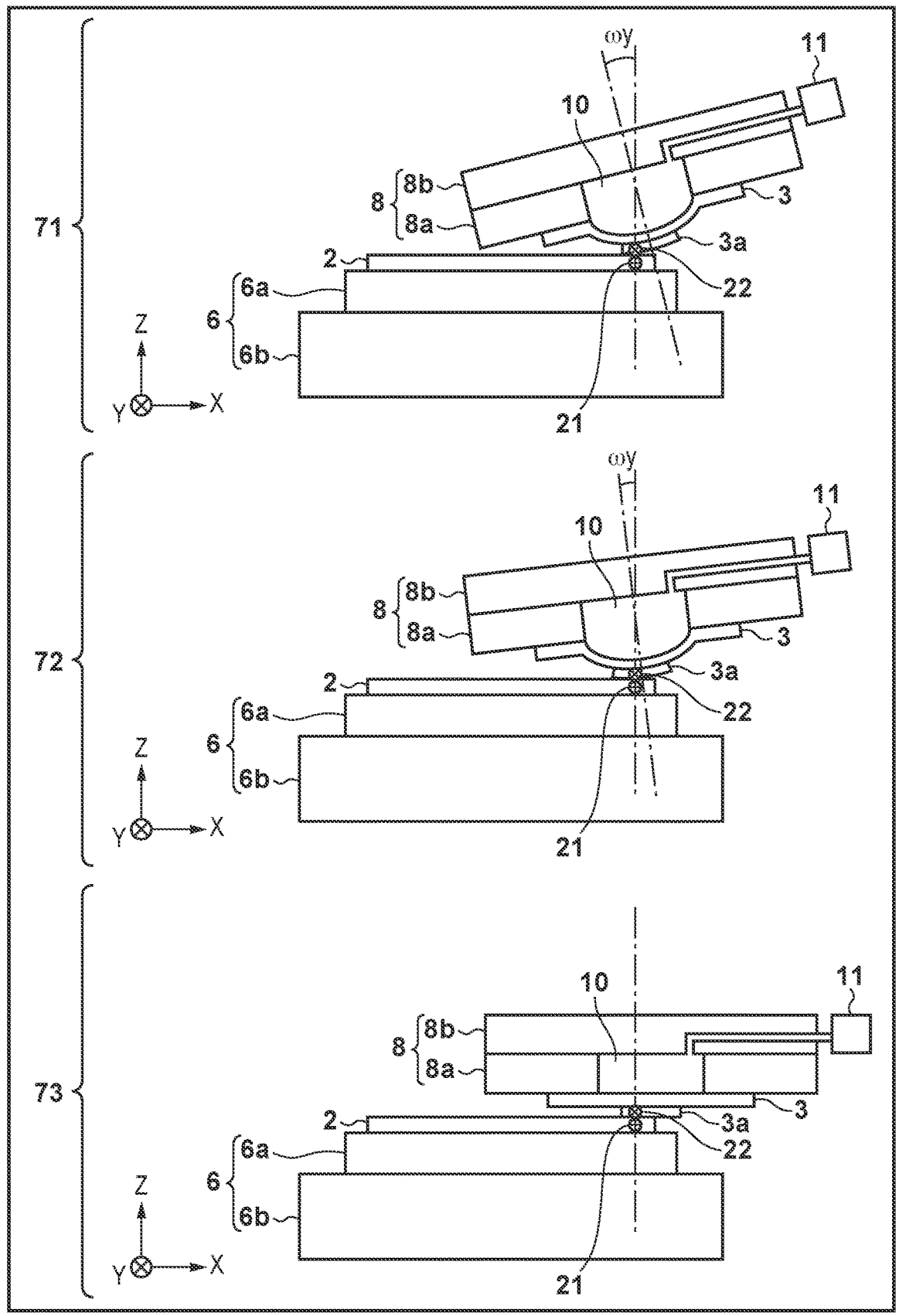
FIG. 7 shows views showing, in time-series, the states of the mold and the substrate according to the first embodiment while increasing a contact area.

An angle $\omega_y$ at which the mold 3 is tilted as described above can be obtained, for example, using a model view (FIG. 6) of the pattern region 3a deformed into the convex shape, by:

$$M_x \sin \omega_y + (M_z - M_h + R)\cos \omega_y = R \quad (1)$$

where, in the model view shown in FIG. 6 and equation (1), $M_c$ represents a rotation center of the mold holding unit 8, $M_x$ represents a distance between the rotation center $M_c$ and a corresponding portion M (corresponding portion 22) in the X direction, $M_z$ represents a distance between the rotation center $M_c$ and the corresponding portion M in the Z direction, R represents a curvature radius of the pattern region 3a deformed into the convex shape, and $M_h$ represents a distance between the rotation center $M_c$ and the barycenter (most protruding portion) of the pattern region 3a. Note that the curvature radius R can be obtained using a pressure value $P_1$ of the space 10 by an experiment, a simulation, or the like.

The distance $M_z$ and the distance $M_h$ can be obtained, using the pressure value $P_1$ of the space 10 adjusted by the first deformation unit 11, by:

$$M_z = \alpha_{z1} \times P_1 + \beta_z$$
$$M_h = \alpha_{z2} \times P_1 + \beta_z \quad (2)$$

where $P_1$ represents the pressure value of the space 10, $\alpha_{z1}$ represents a change ratio of the distance $M_z$ to a change in the pressure value $P_1$, $\alpha_{z2}$ represents a change ratio of the distance $M_h$ to the change in the pressure value $P_1$, $\beta_z$ represents a distance between the rotation center $M_c$, and the corresponding portion M in the Z direction in a state in which the pattern region 3a is not deformed, that is, the pressure value $P_1$ of the space 10 is equal to its external pressure value. The pressure of the space 10 can be measured by, for example, a sensor (for example, an air pressure sensor) provided inside of the space 10, in the pipe, or the like. The change ratio $\alpha_{z1}$, the change ratio $\alpha_{z2}$, and the distance $\beta_z$ can be calculated in advance using the characteristic (for example, the thickness, the elastic modulus, or the like) of the mold 3.

The distance $M_x$ can be obtained, using the pressure value $P_1$ of the space 10 adjusted by the first deformation unit 11, by:

$$M_x = \alpha_x \times P_1 + \beta_x \quad (3)$$

where $\alpha_x$ represents a change ratio of the distance $M_x$ to the change in the pressure value $P_1$, and $\beta_x$ represents a distance between the rotation center $M_c$ and the corresponding portion M in the X direction in the state in which the pattern region 3a is not deformed, that is, the pressure value $P_1$ of the space 10 is equal to its external pressure value. The change ratio $\alpha_x$ and the distance $\beta_x$ can be calculated in advance using the characteristic (for example, the thickness, the elastic modulus, or the like) of the mold 3.

A method of calculating the angle $\omega_y$ at which the mold 3 is tilted in an X-Z coordinate system has been described above. An angle $\omega_x$ at which the mold 3 is tilted in a Y-Z coordinate system can also be calculated using the same method as for the angle $\omega_y$. The angle $\omega_x$ can be obtained by:

$$M_y \sin \omega_x + (M_z - M_h + R)\cos \omega_x = R \quad (4)$$

where $M_y$ represents a distance between the rotation center $M_c$ and the corresponding portion M in the Y direction. The distance $M_y$ can be obtained, using the pressure value $P_1$ of the space 10 adjusted by the first deformation unit 11, by:

$$M_y = \alpha_y \times P_1 + \beta_y \quad (5)$$

where $\alpha_y$ represents a change ratio of the distance $M_y$ to the change in the pressure value $P_1$, and $\beta_y$ represents a distance between the rotation center $M_c$ and the corresponding portion M in the Y direction in the state in which the pattern region 3a is not deformed, that is, when the pressure value $P_1$ of the space 10 is equal to its external pressure value. The change ratio $\alpha_y$ and the distance $\beta_y$ can be calculated in advance using the characteristic (for example, the thickness, the elastic modulus, or the like) of the mold 3.

The corresponding portion 22 of the pattern region 3a can be the lowest position in the first direction by tilting the mold 3 in accordance with the angles $\omega_y$ and $\omega_x$ calculated using the above-described method. Note that if the mold 3 is tilted in a state in which the pattern region 3a is deformed, the corresponding portion 22 of the pattern region 3a shifts relatively to the target portion 21 of the target shot region 2a. Therefore, in step S104, the control unit 15 preferably controls the relative positions of the mold 3 and the substrate 2 based on an amount (to be referred to as a shift amount hereinafter) by which the corresponding portion 22 of the pattern region 3a shifts in the X and Y directions by tilting the mold 3 in the state in which the pattern region 3a is deformed. A shift amount $\delta M_x$ in the X direction and a shift amount $\delta M_y$ in the Y direction can be obtained by:

$$\delta M_x = M_x(1 - \cos \omega_y) + M_z \sin \omega_y$$
$$\delta M_y = M_y(1 - \cos \omega_x) + M_z \sin \omega_x \quad (6)$$

In step S105, the control unit 15 increases the contact area between the pattern region 3a and the imprint material 5 by controlling the mold holding unit 8 to narrow the spacing between the mold 3 and the substrate 2, thereby bringing the pattern region 3a and the imprint material 5 into contact with each other. At this time, the control unit 15 controls the first deformation unit 11 to reduce the deformation of the pattern region 3a as the contact area increases, as shown in 71 to 73 of FIG. 7. At the same time, the control unit 15 controls the relative positions and the relative tilts between the mold 3 and the substrate 2 in accordance with the deformation amount of the pattern region 3a by the first deformation unit 11 so as to maintain the positional relationship between the target portion 21 of the target shot region 2a and the corresponding portion 22 of the pattern region 3a. In FIGS. 7, 71 to 73 are views showing, in time-series, the states of the mold 3 (mold holding unit 8) and the substrate 2 (substrate holding unit 6) while increasing the contact area.

In this case, the control unit 15 preferably controls, while increasing the contact area, the tilt of the mold 3 in accordance with the deformation amount of the pattern region 3a such that the corresponding portion 22 of the pattern region 3a maintains the lowest position in the first direction. For example, based on information indicating the relationship between the deformation amount of the pattern region 3a and the tile of the mold 3 for setting the target position to the lowest position in the deformation amount, the control unit 15 preferably controls the tilt of the mold 3 by the mold holding unit 8 while increasing the contact area. Such information can be created by obtaining the angles at which the mold 3 is tilted from respective equations (1) to (5) by causing, for example, the control unit 15 or an external computer to change the pressure value $P_1$ of the space 10, that is, the deformation amount (curvature radius R) of the pattern region 3a.

The deformation of the pattern region 3a and the tilt of the mold 3 are changed while increasing the contact area. Therefore, the target portion 21 of the target shot region 2a and the corresponding portion 22 of the pattern region 3a shift relatively in the second directions due to these changes. Therefore, the control unit 15 preferably controls, while increasing the contact area, the relative positions of the mold 3 and the substrate 2 such that the shift between the target portion 21 of the target shot region 2a and the corresponding portion 22 of the pattern region 3a in the second directions keeps an allowable range. For example, the control unit 15 preferably controls the relative positions of the mold 3 and the substrate 2 based on information indicating the amount of the relative shift between the target portion 21 of the shot regions 2a and the corresponding portion 22 of the pattern region 3a caused by the deformation amount of the pattern region 3a and the tilt of the mold 3. This information can be created by obtaining the shift amount of the corresponding portion 22 of the pattern region 3a from equation (6) by causing, for example, the control unit 15 or the external computer to change the pressure value $P_1$ of the space 10, that is, the deformation amount (curvature radius R) of the pattern region 3a.

In step S106, the control unit 15 performs alignment between the mold 3 and the substrate 2 based on the result of the detection by the detection unit 16. For example, the control unit 15 obtains the relative positions (in the second directions) of the mark 18 on the mold and the mark 17 on the substrate based on the result of the detection by the detection unit 16, and performs alignment between the mold 3 and the substrate 2 such that the relative positions become target relative positions. In step S107, the control unit 15 controls the irradiation unit 12 to irradiate the imprint material 5 in contact with the mold 3 with light and cures the imprint material 5. In step S108, the control unit 15 controls the mold holding unit 8 to increase the spacing between the mold 3 and the substrate 2, and separates (releases) the mold 3 from the cured imprint material. In step S109, the control unit 15 determines whether there is the shot region 2a (next shot region 2a) to which the pattern of the mold 3 is transferred continuously on the substrate. If the control unit 15 determines that there is the next shot region 2a, the process advances to step S101. If the control unit 15 determines that there is no next shot region 2a, the process advances to step S110. In step S110, the control unit 15 controls the substrate conveying mechanism (not shown) to collect the substrate 2 from the substrate holding unit 6.

As described above, the imprint apparatus 100 of the first embodiment gradually reduces the deformation of the pattern region 3a and the tilt of the mold 3 while increasing the contact area between the imprint material 5 and the pattern region 3a of the mold 3. In addition to this, the imprint apparatus 100 controls the relative positions of the mold 3 and the substrate 2 based on the deformation amount of the pattern region 3a so as to maintain the positional relationship between the mold 3 and the substrate 2 when starting contact between the mold 3 and the imprint material 5. This allows the imprint apparatus 100 to reduce the relative positional shift between the mold 3 and the substrate 2 caused while increasing the contact area between the pattern region 3a and the imprint material 5. It is therefore possible to quickly perform alignment between the mold 3 and the substrate 2.

In the imprint apparatus 100 of the first embodiment, the tilt of the mold 3, and the relative positional shift between the mold 3 and the substrate 2 are controlled based on the deformation amount of the pattern region 3a while increasing the contact area. However, the present invention is not limited to this. For example, the mold 3 and the substrate 2 may relatively shift even when only the pattern region 3a is deformed while increasing the contact area. In this case, it is also possible to reduce the relative positional shift between the mold 3 and the substrate 2 caused while increasing the contact area by controlling the relative positions of the mold 3 and the substrate 2 based on the deformation amount of the pattern region 3a, as in this embodiment.

Second Embodiment

Figure 8:
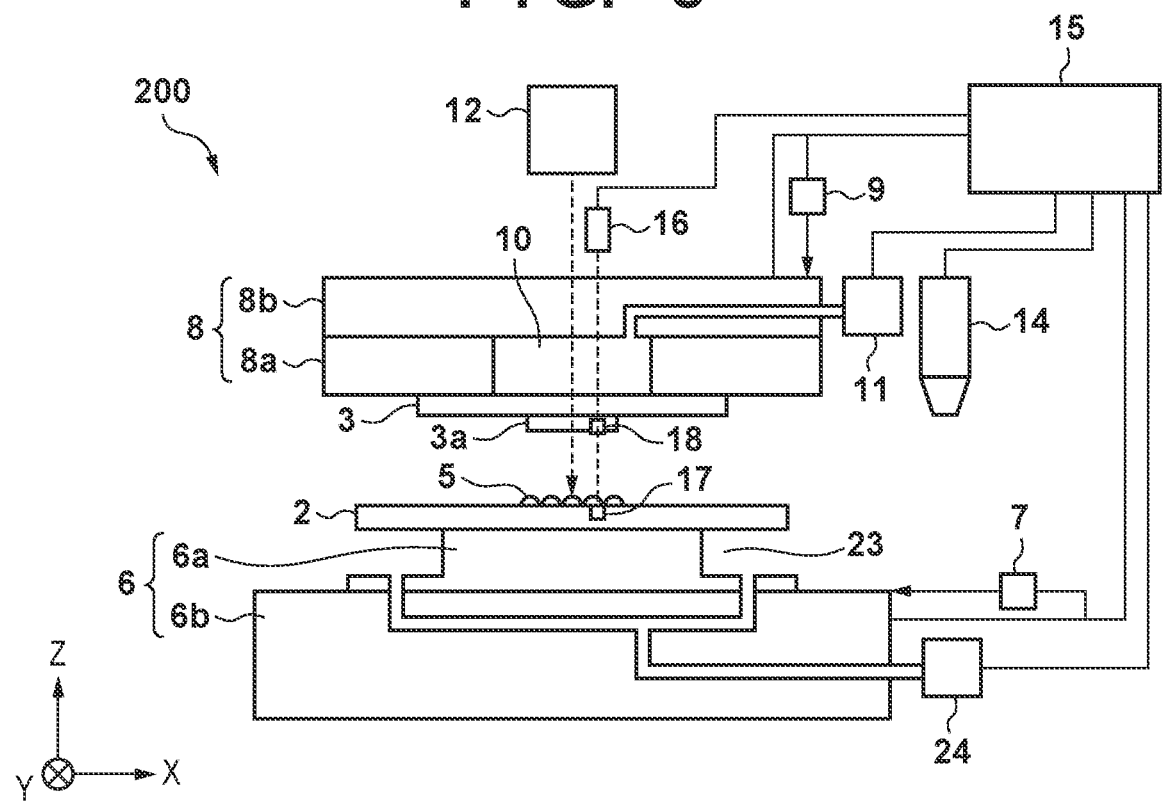
FIG. 8 is a schematic view showing an imprint apparatus according to the second embodiment.

In the first embodiment, an example has been described in which the pattern region 3a of the mold 3 is deformed into the convex shape when bringing the mold 3 and the imprint material 5 on the substrate into contact with each other. In the second embodiment, an example will be described in which each of some shot regions 2a of a substrate 2 is deformed into a convex shape protruding toward a pattern region 3a of a mold 3. FIG. 8 is a schematic view showing an imprint apparatus 200 according to the second embodiment. The imprint apparatus 200 of the second embodiment is different from the imprint apparatus 100 of the first embodiment in the arrangement of a substrate holding unit 6.

Figure 9:
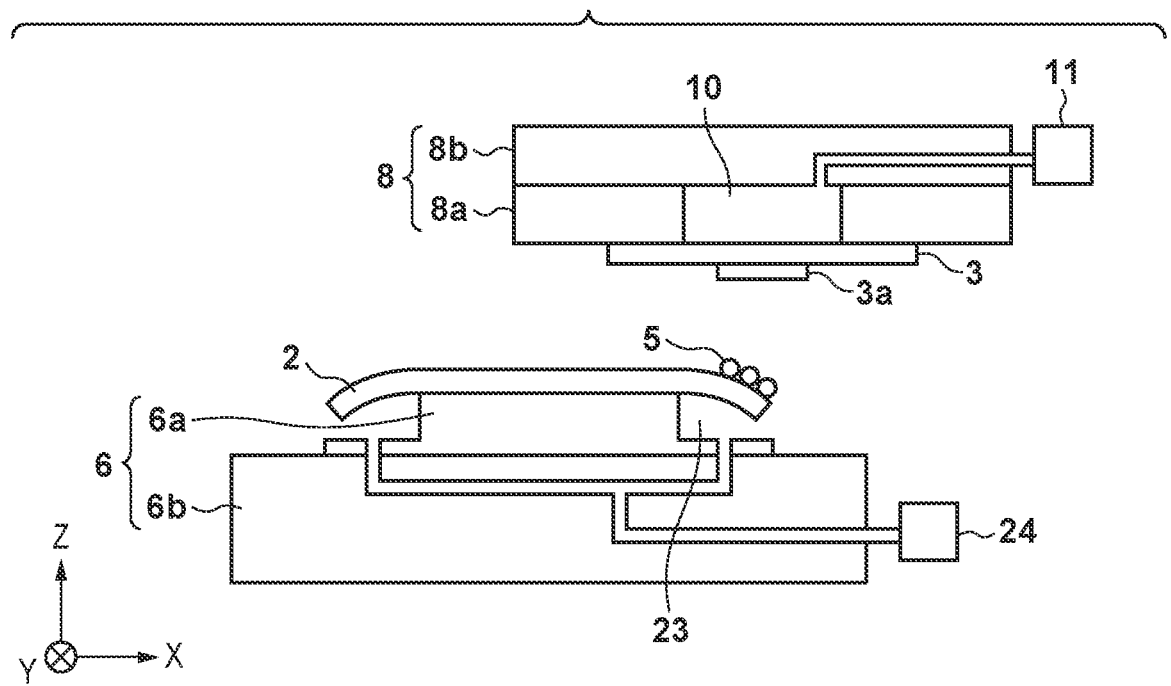
FIG. 9 is a schematic view showing the imprint apparatus in a state in which a shot region arranged in the peripheral portion of a substrate is deformed.
Figure 10:
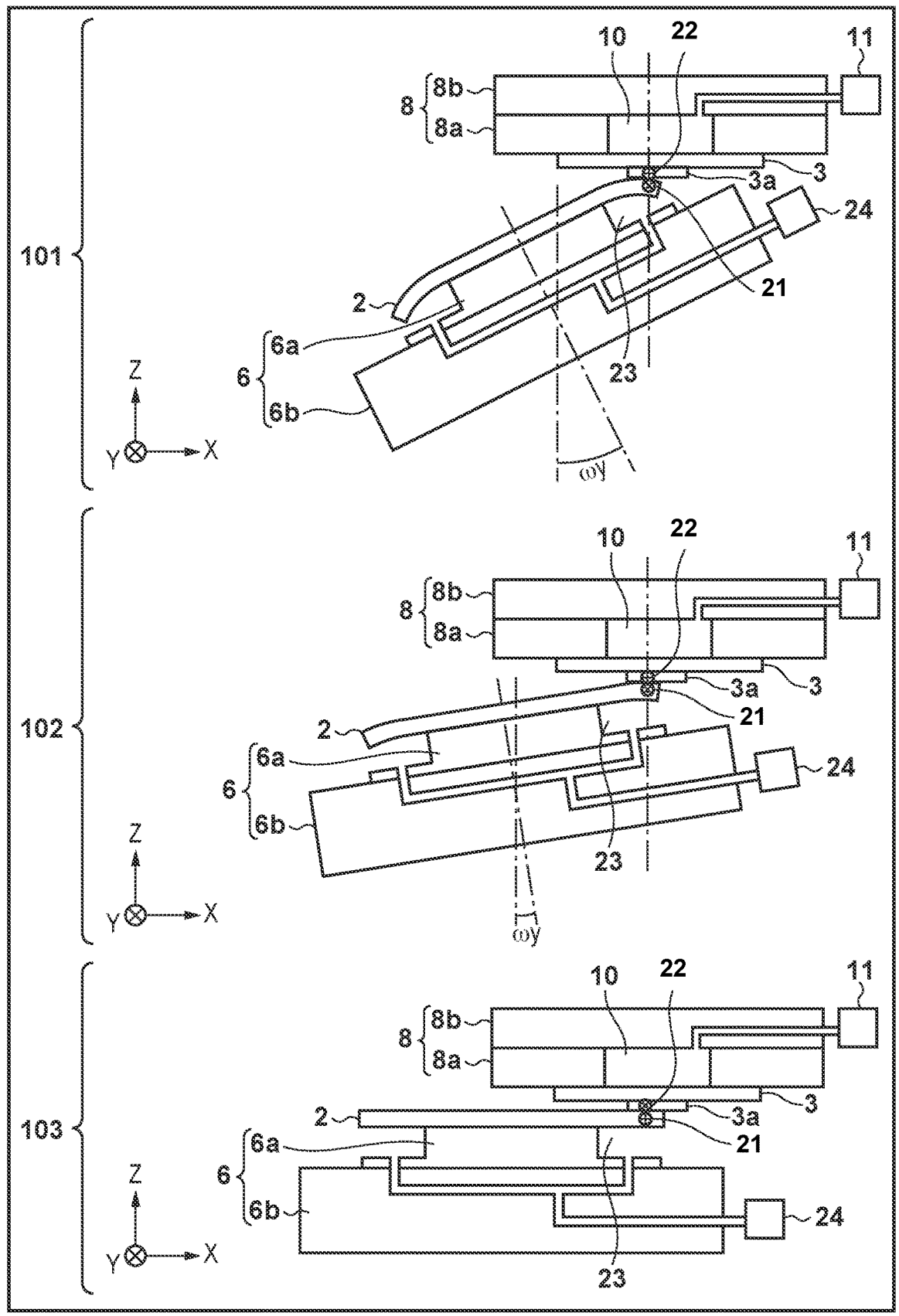
FIG. 10 shows views showing, in time-series, the states of a mold and the substrate according to the second embodiment while increasing a contact area.

In the imprint apparatus 200 of the second embodiment, a substrate chuck 6a which holds the peripheral portion of the substrate 2 including a deficient shot region is partially removed and a space 23 can be provided below the peripheral portion of the substrate 2. A second deformation unit 24 serving as a deformation unit is connected to the space 23 via a pipe. As shown in FIG. 9, the second deformation unit 24 can deform, by adjusting a pressure of the space 23, each of some shot regions 2a (deficient shot region) arranged in the peripheral portion of the substrate 2 into the convex shape protruding toward the pattern region 3a of the mold 3. FIG. 9 is a schematic view showing the imprint apparatus 200 in a state in which the shot regions 2a arranged in the peripheral portion of the substrate 2 are deformed. For example, when contact between the mold 3 and an imprint material 5 on the substrate is started by narrowing the spacing between the mold 3 and the substrate 2, a control unit 15 controls the second deformation unit 24 to deform each shot region 2a in the peripheral portion into the convex shape by adjusting the pressure of the space 23 to be lower than its external pressure. After contact between the pattern region 3a and the imprint material 5 is started, the control unit 15 controls the second deformation unit 24 so as to gradually increase the pressure of the space 23 and to gradually reduce the deformations of the shot regions 2a as the contact area increases. This allows the imprint apparatus 200 to start contact between the imprint material 5 and the pattern region 3a of the mold 3 in a state in which the shot regions 2a are deformed, and to gradually bring the pattern region 3a and the imprint material 5 into contact with each other from a part of the pattern region 3a. As a result, it is possible to suppress a gas from being trapped between the imprint material 5 and the concave portion of the pattern of the mold 3, and to prevent a defect from occurring in the pattern formed by the imprint material 5.

An imprint process for each shot region 2a (deficient shot region) arranged in the peripheral portion of the substrate 2 will now be described. The imprint apparatus 200 of the second embodiment performs the imprint process in accordance with a flowchart shown in FIG. 4, and is different from the imprint apparatus of the first embodiment in steps S104 and S105. Steps S104 and S105 in the imprint apparatus 200 of the second embodiment will be described below.

In step S104, the control unit 15 causes the second deformation unit 24 to deform the target shot region 2a of the substrate 2 into the convex shape, and controls the relative tilts between the mold 3 and the substrate 2 so as to start contact between the pattern region 3a and the imprint material 5 from a target portion 21 of the target shot region 2a. In order to start contact between the pattern region 3a and the imprint material 5 from the target portion 21 of the target shot region 2a, the substrate 2 is preferably tilted such that the target portion 21 out of the target shot region 2a deformed into the convex shape becomes the highest position in the first direction. That is, the substrate 2 is preferably tilted to arrange the target portion 21 on a side closest to the mold. Therefore, the control unit 15 preferably causes the substrate holding unit 6 to tilt the substrate 2 in accordance with the deformation of the target shot region 2a such that the target portion 21 of the target shot region 2a becomes the highest position in the first direction. The angle at which the substrate 2 is tilted as described above can be obtained using the same method as the method of obtaining the angle at which the mold 3 is tilted in the first embodiment.

If the substrate 2 is tilted in a state in which the target shot region 2a is deformed, the target portion 21 of the target shot region 2a shifts relatively to a corresponding portion 22 of the pattern region 3a. Therefore, in step S104, the control unit 15 preferably controls the relative positions of the mold 3 and the substrate 2 based on an amount (to be referred to as a shift amount hereinafter) by which the target portion 21 of the target shot region 2a shifts in the second directions by tilting the substrate 2 in the state in which the target shot region 2a is deformed. The shift amount in the second directions can be obtained by the same method as the method of obtaining the shift amount in the first embodiment.

In step S105, the control unit 15 increases the contact area between the pattern region 3a and the imprint material 5 by controlling a mold holding unit 8 to narrow the spacing between the mold 3 and the substrate 2, thereby bringing the pattern region 3a and the imprint material 5 into contact with each other. At this time, the control unit 15 controls the second deformation unit 24 to reduce the deformation of the target shot region 2a as the contact area increases, as shown in 101 to 103 of FIG. 10. At the same time, the control unit 15 controls the relative positions and the relative tilts between the mold 3 and the substrate 2 in accordance with the deformation amount of the target shot region 2a so as to maintain the positional relationship between the target portion 21 of the target shot region 2a and the corresponding portion 22 of the pattern region 3a. In FIGS. 10, 101 to 103 are views showing, in time-series, the states of the mold 3 (mold holding unit 8) and the substrate 2 (substrate holding unit 6) while increasing the contact area.

In this case, the control unit 15 preferably controls, while increasing the contact area, the tilt of the substrate 2 in accordance with the deformation amount of the target shot region 2a such that the target portion 21 of the target shot region 2a maintains the highest position in the first direction. For example, based on information indicating the relationship between the deformation amount of the target shot region 2a and the tile of the substrate 2 for setting the target portion 21 to the highest position in the deformation amount, the control unit 15 preferably controls the tilt of the substrate by the substrate holding unit 6 while increasing the contact area. Such information can be created by obtaining the respective angles at which the substrate 2 is tilted by causing, for example, the control unit 15 or an external computer to change the pressure value of the space 23, that is, the deformation amount of the target shot region 2a.

The deformation of the target shot region 2a and the tilt of the substrate 2 are changed while increasing the contact area. Therefore, the target portion 21 of the target shot region 2a and the corresponding portion 22 of the pattern region 3a shift relatively in the second directions due to these changes. Therefore, the control unit 15 preferably controls, while increasing the contact area, the relative positions of the mold 3 and the substrate 2 such that the shift between the target portion 21 of the target shot region 2a and the corresponding portion 22 of the pattern region 3a in the second directions keeps an allowable range. For example, the control unit 15 preferably controls the relative positions of the mold 3 and the substrate 2 based on information indicating the amount of the relative shift between the target portion 21 of the target shot region 2a and the corresponding portion 22 of the pattern region 3a caused by the deformation amount of the target shot region 2a and the tilt of the substrate 2. Such information can be created by obtaining the shift amount of the target portion 21 of the target shot region 2a by causing, for example, the control unit 15 or the external computer to change the pressure value of the space 23, that is, the deformation amount of the target shot region 2a.

As described above, the imprint apparatus 200 of the second embodiment is configured to deform each of some shot regions 2a of the substrate 2 into the convex shape protruding toward the pattern region 3a of the mold 3. The imprint apparatus 200 reduces the deformations of the shot regions 2a and the tilt of the substrate 2 while increasing the contact area between the pattern region 3a and the imprint material 5. In addition to this, the imprint apparatus 200 controls the relative positions of the mold 3 and the substrate 2 based on the deformation amounts of the shot regions 2a so as to maintain the positional relationship between the mold 3 and the substrate 2 when starting contact between the mold 3 and the imprint material 5. This allows the imprint apparatus 200 to reduce the relative positional shift between the mold 3 and the substrate 2 while increasing the contact area between the pattern region 3a and the imprint material 5, as in the first embodiment. It is therefore possible to quickly perform alignment between the mold 3 and the substrate 2.

Third Embodiment

In the first embodiment, the example has been described in which the pattern region 3a of the mold 3 is deformed into the convex shape. In the second embodiment, the example has been described in which each shot region 2a of the substrate 2 is deformed into the convex shape. In the third embodiment, an example will be described, with reference to FIG. 11, in which both a pattern region 3a and shot regions 2a are deformed when bringing the pattern region 3a and an imprint material 5 on the substrate into contact with each other. In FIGS. 11, 111 to 113 are views showing, in time-series, the states of a mold 3 (mold holding unit 8) and a substrate 2 (substrate holding unit 6) while increasing a contact area. An imprint apparatus of the third embodiment and the imprint apparatus 200 of the second embodiment have the same apparatus configuration, and thus a description of the apparatus configuration will be omitted.

Figure 11:
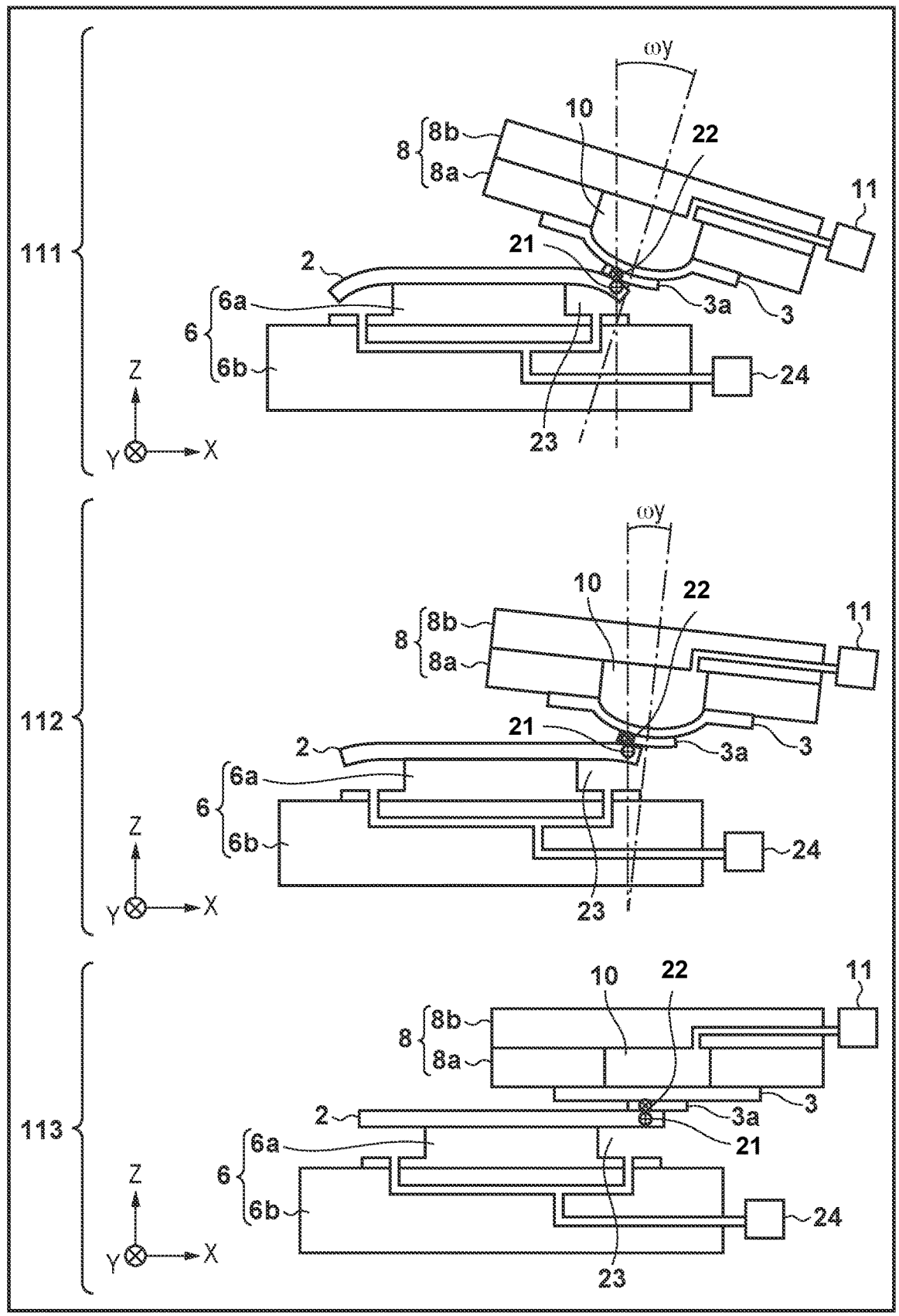
FIG. 11 shows views showing, in time-series, the states of a mold and a substrate according to the third embodiment while increasing a contact area.

As shown in FIG. 11, a control unit 15 controls, while increasing the contact area, a first deformation unit 11 so as to reduce the deformation of the pattern region 3a and controls a second deformation unit 24 so as to reduce the deformation of the target shot region 2a. At the same time, the control unit 15 controls the relative positions and the relative tilts between the mold 3 and the substrate 2 so as to maintain the positional relationship between a target portion 21 of the target shot region 2a and a corresponding portion 22 of the pattern region 3a. The relative positions and the relative tilts between the mold 3 and the substrate 2 can be controlled based on the deformation amount of the pattern region 3a and the deformation amount of the target shot region 2a. This allows the imprint apparatus to reduce the relative positional shift between the mold 3 and the substrate 2 while increasing the contact area between the pattern region 3a and the imprint material 5.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern in a resin applied to a substrate (step of performing an imprint process on the substrate) using the above-described imprint apparatus, and a step of processing the substrate on which the pattern has been formed (the substrate on which the imprint process has been performed) in the preceding step. This manufacturing method further includes other known steps (oxidation, deposition, vapor deposition, doping, planarization, etching, resist removal, dicing, bonding, packaging, and the like). The method of manufacturing the article according to this embodiment is advantageous in at least one of the performance, the quality, the productivity, and the production cost of the article, as compared to a conventional method.

Other Embodiments

Embodiment(s) of the present invention (the control unit) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-080345 filed on Apr. 9, 2015, which is hereby incorporated by reference herein in its entirety.

What is claimed is:

1. An imprint apparatus which forms a pattern in an imprint material on a substrate having a plurality of shot regions by using a mold having a pattern region where a pattern to be transferred to each shot region of the plurality of shot regions is formed, the imprint apparatus comprising:
 a deformation unit configured to deform at least one of the mold and the substrate into a convex shape protruding toward the other;
 a detection unit configured to detect a mark provided on the mold and a mark provided on the substrate; and
 a control unit configured to (i) determine a first position in a first shot region on the substrate, (ii) control a process of starting contact between the mold and the imprint material such that the mold initially contacts the imprint material at a first position on the mold and the imprint material initially contacts the mold at a first position on the imprint material, which corresponds to the first position in the first shot region on the substrate, in a state in which the at least one of the mold and the substrate is deformed by the deformation unit, and then increasing a contact area between the mold and the imprint material by decreasing a deformation amount of the at least one of the mold and the substrate by the deformation unit, (iii) cause the detection unit to detect the mark provided on the mold and the mark provided on the substrate, (iv) obtain a detection result according to the detection unit detecting the mark provided on the mold and the mark provided on the substrate, and (v) determine relative positions of the mark provided on the mold and the mark provided on the substrate based on the obtained detection result,
 wherein the control unit is configured to control a position of the mold relative to the substrate, a position of the substrate relative to the mold, or both the position of the mold relative to the substrate and the position of the substrate relative to the mold while increasing the contact area between the mold and the imprint material and without relying upon the detection result of the detection unit, such that the first position on the mold at which the mold initially contacted the imprint material is maintained within an allowable range of the first position in the first shot region on the substrate corresponding to the first position on the imprint material at which the imprint material initially contacted the mold.

2. The imprint apparatus according to claim 1, wherein the control unit is configured to control a relative tilt between the mold and the substrate based on the deformation amount of the at least one of the mold and the substrate, so as to start the contact between the mold and the imprint material from a portion other than a barycenter of a pattern region formed on the mold.

3. The imprint apparatus according to claim 2, wherein the control unit is configured to control the relative tilt between the mold and the substrate based on the deformation amount of the at least one of the mold and the substrate, so as to reduce the relative tilt while increasing the contact area.

4. The imprint apparatus according to claim 2, wherein the control unit is configured to control the position of the mold relative to the substrate, the position of the substrate relative to the mold, or both the position of the mold relative to the substrate and the position of the substrate relative to the mold based on information indicating a relative shift amount between the mold and the substrate caused by changing the deformation amount of the at least one of the mold and the substrate and the relative tilt between the mold and the substrate.

5. The imprint apparatus according to claim 1, wherein the deformation unit includes a first deformation unit configured to deform the mold into a convex shape with a central portion protruding toward the substrate, and
the control unit is configured to control the position of the mold relative to the substrate, the position of the substrate relative to the mold, or both the position of the mold relative to the substrate and the position of the substrate relative to the mold based on a deformation amount of the mold by the first deformation unit.

6. The imprint apparatus according to claim 5, wherein the control unit is configured to control a relative tilt between the mold and the substrate based on the deformation amount of the mold, so as to start the contact between the mold and the imprint material from a portion of the mold other than a portion of the mold where the mold protrudes the most.

7. The imprint apparatus according to claim 1, wherein the deformation unit includes a second deformation unit configured to deform the substrate into a convex shape partially protruding toward the mold, and
the control unit is configured to control the position of the mold relative to the substrate, the position of the substrate relative to the mold, or both the position of the mold relative to the substrate and the position of the substrate relative to the mold based on a deformation amount of the substrate by the second deformation unit.

8. The imprint apparatus according to claim 1, wherein the substrate includes a deficient shot region which is arranged in a peripheral portion of the substrate and to which only a part of a pattern of the mold is transferred, and
the control unit is configured to control the process so as to bring the mold and the imprint material supplied on the deficient shot region into contact with each other.

9. The imprint apparatus according to claim 8, wherein the control unit is configured to control the process so as to start the contact between the mold and the imprint material from a barycenter of the deficient shot region.

10. The imprint apparatus according to claim 1, wherein the control unit is configured to control the position of the mold relative to the substrate, the position of the substrate relative to the mold, or both the position of the mold relative to the substrate and the position of the substrate relative to the mold, based on the deformation amount of the at least one of the mold and the substrate by the deformation unit.

11. The imprint apparatus according to claim 1, wherein the control unit is configured to start the contact between the mold and the imprint material in a state of relatively tilting the mold and the substrate, and is configured to control a relative tilt between the mold and the substrate such that the relative tilt between the mold and the substrate is reduced while increasing the contact area.

12. An imprint apparatus which forms a pattern in an imprint material on a substrate having a plurality of shot regions by using a mold having a pattern region where a pattern to be transferred to each shot region of the plurality of shot regions is formed, the imprint apparatus comprising:
a substrate holder configured to hold the substrate;
a mold holder configured to hold the mold;
a deformer configured to deform at least one of the mold and the substrate into a convex shape protruding toward the other by adjusting a pressure of a space respectively associated with the at least one of the mold and the substrate;
a detector configured to detect a mark provided on the mold and a mark provided on the substrate; and
processing circuitry configured to (i) determine a first position in a first shot region on the substrate, (ii) control at least one of the substrate holder and the mold holder so as to cause the mold and the imprint material to contact each other such that the mold initially contacts the imprint material at a first position on the mold and the imprint material initially contacts the mold at a first position on the imprint material, which corresponds to the first position in the first shot region on the substrate, in a state in which the at least one of the mold and the substrate is deformed by the deformer, and to cause a contact area between the mold and the imprint material to increase while a deformation amount of the at least one of the mold and the substrate is decreased by the deformer, (iii) cause the detector to detect the mark provided on the mold and the mark provided on the substrate, (iv) obtain a detection result according to the detector detecting the mark provided on the mold and the mark provided on the substrate, and (v) determine relative positions of the mark provided on the mold and the mark provided on the substrate based on the obtained detection result,
wherein the processing circuitry is configured to control the at least one of the substrate holder and the mold holder so as to control a position of the mold relative to the substrate, a position of the substrate relative to the mold, or both the position of the mold relative to the substrate and the position of the substrate relative to the mold while the contact area between the mold and the imprint material is being increased and the deformation amount of the at least one of the mold and the substrate is being decreased by the deformer, and without relying upon the detection result of the detector, such that the first position on the mold at which the mold initially contacted the imprint material is maintained within an allowable range of the first position in the first shot region on the substrate corresponding to the first position on the imprint material at which the imprint material initially contacted the mold.

13. The imprint apparatus according to claim 12, wherein the processing circuitry is configured to control the at least one of the substrate holder and the mold holder so as to cause the contact between the mold and the imprint material to start in a state in which at least one of the mold and the substrate is tilted, and to control a relative tilt between the mold and the substrate such that the relative tilt between the mold and the substrate is decreased while the contact area between the mold and the imprint material is being increased.

14. The imprint apparatus according to claim 13, wherein the processing circuitry is configured to control the position of the mold relative to the substrate, the position of the substrate relative to the mold, or both the position of the mold relative to the substrate and the position of the substrate relative to the mold while the contact area between the mold and the imprint material is being increased, the deformation amount of the at least one of the mold and the substrate is being decreased by the deformer, and the relative tilt between the mold and the substrate is being decreased such that the first position on the mold at which the mold initially contacted the imprint material is maintained within the allowable range of the first position on the substrate corresponding to the first position on the imprint material at which the imprint material initially contacted the mold.

15. The imprint apparatus according to claim 1, wherein the control unit is configured to, after controlling the position of the mold relative to the substrate, the position of the substrate relative to the mold, or both the position of the mold relative to the substrate and the position of the substrate relative to the mold while increasing the contact area between the mold and the imprint material and without relying upon the detection result of the detection unit, such that the first position on the mold at which the mold initially contacted the imprint material is maintained within the allowable range of the first position in the first shot region on the substrate, perform an alignment between the mold and the substrate by relying upon the detection result of the detection unit.

* * * * *